United States Patent
Akane et al.

(10) Patent No.: US 6,432,848 B2
(45) Date of Patent: Aug. 13, 2002

(54) PROCESS FOR FORMATION OF CAP LAYER FOR SEMICONDUCTOR

(75) Inventors: Toshimitsu Akane, Tokyo; Koji Sugioka; Katsumi Midorikawa, both of Wako, all of (JP); Jan J. Dubowski, Ottawa (CA)

(73) Assignee: Riken, Saitama (JP)

( * ) Notice: Subject to any disclaimer, the term of this patent is extended or adjusted under 35 U.S.C. 154(b) by 0 days.

(21) Appl. No.: 09/769,386

(22) Filed: Jan. 26, 2001

(30) Foreign Application Priority Data

Jan. 27, 2000 (JP) .......................................... 2000-018612

(51) Int. Cl.⁷ .............................................. H01L 21/42
(52) U.S. Cl. ........................................................ 438/799
(58) Field of Search ................................ 438/478, 479, 438/483, 767, 768, 779, 796, 799

(56) References Cited

U.S. PATENT DOCUMENTS 4,735,921 A * 4/1988 Soukiassian 6,303,473 B1 * 10/2001 Heffernan et al.

OTHER PUBLICATIONS

Ghandhi, S., "VLSI Fabrication Principles", John Wiley, second edition (1994), pp. 483–484.*

* cited by examiner

Primary Examiner—Keith Christianson
(74) Attorney, Agent, or Firm—Birch, Stewart, Kolasch & Birch, LLP (57) ABSTRACT

A process for the formation of a cap layer for semiconductors with a low degree of contamination wherein the cap layer is easily formed on the surface of a semiconductor, and binding force thereof with the surface of the semiconductor is strong and stabilized, besides only the cap layer is selectively removed easily, comprises the steps of introducing nitrogen atom into a surface of a semiconductor; combining a component element of the semiconductor in the vicinity of the surface of the semiconductor into which the nitrogen atom has been introduced with the nitrogen atom to form a nitride compound being a compound of the component element of the semiconductor and the nitrogen atom; and utilizing the nitride compound as a cap layer for the surface of the semiconductor.

3 Claims, 10 Drawing Sheets

PROCESS FOR FORMATION OF CAP LAYER FOR SEMICONDUCTOR

BACKGROUND OF THE INVENTION

1. Field of The Invention

The present invention relates to a process for the formation of a cap layer for semiconductors, and more particularly to a process for the formation of a cap layer for semiconductors which is suitably used for a variety of semiconductors such as element semiconductors of Si (silicon) and Ge (germanium), and compound semiconductors of the group III-V or II-VI compounds, particularly the process is extremely effective for the III-V compound semiconductors.

2. Description of The Related Art

Heretofore, it has been known that since compound semiconductors of InGaAs quaternary mixed crystal system which lattice-match with InP (indium phosphide) can vary its bandgap from 1.35 eV to 0.72 eV, such compound semiconductors are applicable for long wavelength semiconductor laser device.

It has been known also that since InP has a high saturation drift velocity, such InP is applicable for ultrafast FET.

Moreover, it has been known that HEMT (High-Electron Mobility Transistor) using heterojunction of $In_{0.52}Al_{0.48}As/In_{0.53}Ga_{0.47}As$ which lattice-matches with InP obtains such high band offset of 53 eV in conduction band, so that it is possible to realize ultrahigh speed operation due to formation of efficient two-dimensional electron gas (2DEG).

Thus, it is expected that a device prepared from InP or the related materials thereof can exhibit higher performance exceeding that of a device prepared from a material of GaAs (gallium arsenide) system as described above.

Meanwhile, no cap layer which can be easily formed on the surface of a semiconductor, and exhibits strong binding power and stability with respect to the surface of a semiconductor, besides only such cap layer can be selectively removed easily has been present in a variety of semiconductors, for example, compound semiconductors such as InP, and element semiconductors such as Ge unlike the case of "Si in $SiO_2$ (silicon dioxide)", and more specifically "$SiO_2$ being an oxide formed on the surface of Si as a cap layer".

Especially, it has been known that an oxide (i.e., an oxide of a component element of III-V compound semiconductors) formed on a surface of the III-V compound semiconductors such as InP brings about deterioration of electric characteristic properties such as increase in reverse leakage current, it is not desirable to use such oxide as a cap layer.

Therefore, in order to passivate a surface of such III-V compound semiconductors and to stabilize the same, a manner for passivating chemically the surface of the III-V compound semiconductors has been heretofore taken.

As a conventional manner for passivating a surface of III-V compound semiconductors, concerning a wafer of, for example, GaAs, GaP (gallium phosphide) or InP, "sulfur passivation" wherein such wafer is treated in a solution containing S (sulfur) or a gas containing S (sulfur), whereby dangling bonds of a component element on a surface of the wafer are terminated with sulfur has been widely known.

However, the above described "surface passivation" involves such a problem which brings about pollution due to use of sulfur.

Furthermore, there have been also pollution problems of heavy metal contamination or disposal of spent solution (waste liquor).

Accordingly, it has been strongly demanded to provide a process for the formation of a cap layer for semiconductors which can be easily formed on the surface of a semiconductor, exhibits strong binding power and stabilization with respect to the surface of a semiconductor, and only such cap layer can be selectively removed easily, besides the cap layer has a low degree of pollution or contamination.

OBJECTS AND SUMMARY OF THE INVENTION

The present invention has been made in view of needs with respect to the above described prior art, so that an object of the invention is to provide a process for the formation of a cap layer for semiconductors which can be easily formed on the surface of a semiconductor, exhibits strong binding power and stabilization with respect to the surface of a semiconductor, and only such cap layer can be selectively removed easily, besides the cap layer has a low degree of contamination.

In order to achieve the above described object, the present invention has been constituted in such that nitrogen (N) which has strong binding power with (an)other element(s) as well as a low degree of contamination is introduced into the surface of a semiconductor, whereby a component element in the vicinity of the surface of the semiconductor is allowed to combine with nitrogen atom to form a nitride compound being a chemically passivated compound which is formed on the surface of the semiconductor, and such a nitride compound is utilized as a cap layer for the surface of a semiconductor.

The present invention as described above can be applied as a process for the formation of a cap layer for a general surface of an optical device or an electron device wherein, for example, a compound semiconductor is employed, and particularly the invention can be utilized as a process for the formation of a cap layer for preventing oxidation of a surface of a resonator in a semiconductor laser.

Namely, the present invention concerns a process for the formation of a cap layer for semiconductors comprising the steps of introducing nitrogen atom into a surface of a semiconductor; combining a component element of the semiconductor in the vicinity of the surface of the semiconductor into which the nitrogen atom has been introduced with the nitrogen atom to form a nitride compound being a compound of the component element of the semiconductor and the nitrogen atom on the surface of the semiconductor; and utilizing the nitride compound as a cap layer for the surface of the semiconductor.

Therefore, according to the present invention, since a cap layer of a nitride compound is formed by feeding only nitrogen onto the surface of a semiconductor, the cap layer can be very easily formed on the surface of the semiconductor, and in addition, nitrogen has a strong binding force and is stabilized with respect to other elements composing the semiconductor.

Moreover, only such cap layer of a nitride compound can be selectively removed from the surface of a semiconductor in accordance with such easy treatment that the cap layer is subjected to washing treatment by the use of an acid solution.

Since nitrogen is a material which does not become a cause of contamination unlike sulfur and the like, there is no fear of contamination, besides the formation of a cap layer can be carried out in accordance with a dry process without employing any solution, so that there is required no processing for a spent solution (waste liquor).

Furthermore, the present invention concerns a process for the formation of a cap layer for semiconductors comprising the steps of disposing a semiconductor in a gas containing nitrogen atom as a component element; heat-treating a surface of the semiconductor thereby to introduce the nitrogen atom contained in the gas into a surface of a semiconductor; combining a component element of the semiconductor in the vicinity of the surface of the semiconductor into which the nitrogen atom contained in the gas has been introduced with the nitrogen atom contained in the gas to form a nitride compound being a compound of the component element of the semiconductor and the nitrogen atom contained in the gas on the surface of the semiconductor; and utilizing the nitride compound as a cap layer for the surface of the semiconductor.

In the above described process, the heat treatment for the surface of the semiconductor may be such an instantaneous heat treatment that the surface of the semiconductor is instantaneously heated, and then cooled instantaneously, whereby a temperature in the surface of the semiconductor is maintained at a low temperature.

Further, the above described instantaneous heat treatment may be executed by irradiating pulse laser beam having a predetermined frequency and a predetermined fluence onto the surface of the semiconductor with a predetermined pulse number.

Still further, the above described semiconductor may be, for example, a III-V compound semiconductor.

Yet further, the present invention concerns a process for the formation of a cap layer for semiconductors comprising the steps of disposing, as a semiconductor, InP being a III-V compound semiconductor in ammonia gas being a gas containing nitrogen atom as a component element; heat-treating a surface of the InP in such a manner that pulse laser beam having a predetermined frequency and a predetermined fluence is irradiated onto the surface of the InP with a predetermined pulse number while maintaining a temperature in the surface of the InP at a low temperature thereby to introduce the nitrogen atom contained in the ammonia gas into the surface of the InP; combining In and P being component elements of the InP in the vicinity of the surface of the InP into which the nitrogen atom contained in the ammonia gas has been introduced with the nitrogen atom contained in the ammonia gas to form a thin film of $InN_x$ and $PN_x$ being a compound of In and P being the component elements of the InP and the nitrogen atom contained in the ammonia gas on the surface of the InP; and utilizing the thin film of the $InN_x$ and $PN_x$ as a cap layer for the surface of the InP.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

An example of preferred embodiments of a process for the formation of a cap layer for semiconductors according to the present invention will be described in detail hereinafter.

In an example of preferred embodiments of a process for the formation of a cap layer for semiconductors according to the present invention, nitrogen is introduced into the surface of a semiconductor, whereby component elements in the vicinity of the surface of the semiconductor are combined with nitrogen atom to form a nitride compound being a chemically passivated compound which has been formed on the surface of the semiconductor, and such a nitride compound is utilized as a cap layer for the surface of the semiconductor.

Due to a thin film of such nitride compound which has been formed on the surface of a semiconductor, oxidation on the surface of the semiconductor in the atmosphere can be prevented, so that the thin film of the nitride compound functions sufficiently as a cap layer.

As a semiconductor on which has been formed a cap layer according to the present invention, there are a variety of object semiconductors such as element semiconductors and compound semiconductors, however, in the following preferred embodiments which will be described hereunder, such a case where InP being a III-V compound semiconductors on which a cap layer is to be formed is used for easy understanding of the present invention will be explained.

Figure 1:
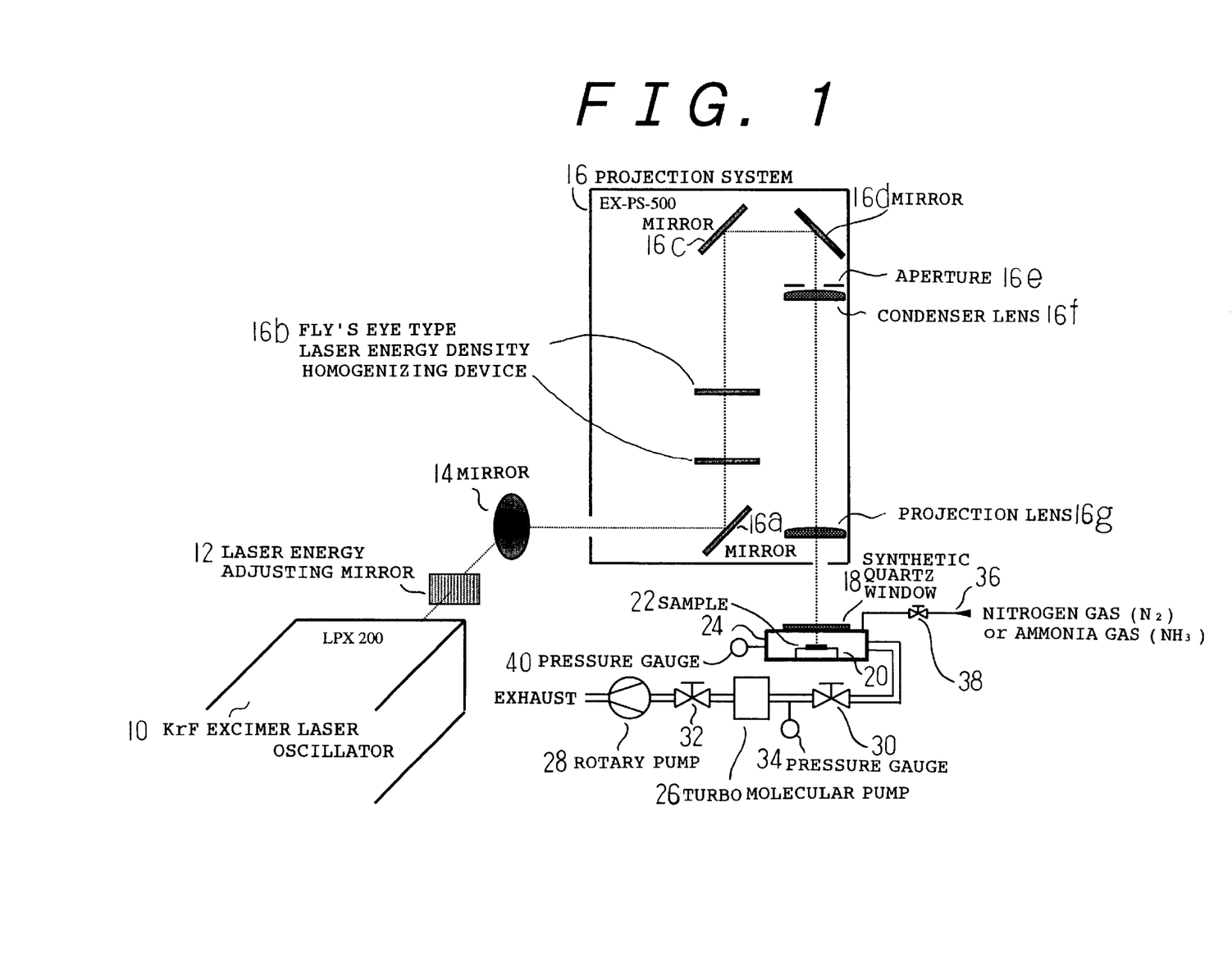
FIG. 1 is a conceptual, constitutional explanatory view showing an example of equipment components for executing a process for the formation a cap layer of a semiconductors according to the present invention.

First, FIG. 1 is a conceptual, constitutional explanatory view showing an example of equipment components for executing a process for the formation a cap layer of a semiconductors according to the present invention.

The equipment shown in FIG. 1 is laser irradiating equipment wherein an ammonia gas being a gas containing nitrogen atom is used as a component element, and pulse laser beam is irradiated on a semiconductor (an InP substrate in the present embodiment) in ammonia gas atmosphere under normal pressure (760 Torr) to carry out a heating treatment (hereinafter referred optionally to as "laser irradiation treatment") is provided with a KrF excimer laser oscillator 10 generating pulse laser beam; a laser energy adjusting mirror 12 for adjusting laser energy of pulse laser beam output from the KrF excimer laser oscillator 10; a mirror 14 for inputting the pulse laser beam output from the laser energy adjusting mirror 12 to a projection system 16 which will be mentioned hereunder; a projection system 16 for homogenizing a laser energy density of the pulse laser beam input through the mirror 14 as well as for setting an irradiation region thereof; and a vacuum chamber 24 having a synthetic quartz window 18 disposed for adapting in such that the pulse laser beam output from the projection system 16 can be input inside the vacuum chamber 24 as well as containing a sample table 20, on which a semiconductor (the InP substrate in the present embodiment) has been placed as a sample 22, disposed in the interior thereof.

In this constitution, the respective components are located in such that pulse laser beam output from the projection system 16 through the synthetic quartz window 18 is irradiated on the sample 22 placed on the sample table 20 inside the vacuum chamber 24.

Furthermore, a well-known vacuum system composed of a turbo molecular pump 26, a rotary pump 28, valve 30, a valve 32, and a pressure gauge 34 and the like is connected to the vacuum chamber 24, whereby the interior of the vacuum chamber 24 can be adapted to be in a vacuum state as occasion demands.

Moreover, to the vacuum chamber 24 is connected a pipeline 36 for introducing selectively nitrogen gas ($N_2$) or ammonia gas ($NH_3$) from a gas bomb enclosing the nitrogen gas (not shown) or a gas bomb enclosing the ammonia gas (not shown) through a selector valve (not shown) and the like, and it is arranged in such that the nitrogen gas or the ammonia gas can be introduced appropriately into the vacuum chamber 24 by opening and closing a valve 38.

The above described projection system 16 includes a mirror 16a for deviating an optical path of pulse laser beam input through the mirror 14; fly's eye type laser energy density homogenizing devices 16b, 16b each homogenizing a laser energy density of the pulse laser beam the optical path of which was deviated by the mirror 16a; a mirror 16c and a mirror 16d each for deviating an optical path of the pulse laser beam output from the fly's eye type laser energy density homogenizing device 16b; an aperture 16e provided with an opening for setting an irradiation region of pulse laser beam (2.2 mm×2.2 mm (in case of laser irradiation treatment) or 4 mm×4 mm (in case of measurement or the like after the laser irradiation treatment) in the present embodiment) as a result of passing the pulse laser beam, the optical path of which was deviated by the mirror 16d, through the opening; a condenser lens 16f for condensing the pulse laser beam with which has been set an irradiation region as a result of passing through the opening of the aperture 16e; and a projection lens 16g for outputting the pulse laser beam condensed by the condenser lens 16f towards the synthetic quartz window 18 in the chamber 24.

Reference numeral 40 designates a pressure gauge for measuring a pressure in the vacuum chamber 24.

In the above described constitution, a case where an InP substrate is used as the sample 22 being an object semiconductor for forming a cap layer will be described.

First, an InP (100) substrate being the sample 22 (an experiment was made with the use of the InP (100) substrate as an InP substrate) was washed with an acid solution of "HCl:HF:$H_2O$=1:1:4" at ordinary temperature for 3 minutes.

Immediately after the completion of washing, the InP (100) substrate being the sample 22 was rested on the sample table 20 in the vacuum chamber 24, and then $N_2$ purge was made by introducing nitrogen gas into the vacuum chamber 24 through the pipeline 36.

After the $N_2$ purge, ammonia gas was introduced into the vacuum chamber 24 through the pipeline 36 to fill up the vacuum chamber under a pressure of 760 Torr, and pulse laser beam output from the KrF excimer laser oscillator 10 was irradiated on a surface of the InP (100) substrate to heat the surface of the InP (100) substrate.

As a result of the treatment described above, as illustrated in FIG. 2, component elements in the vicinity of a surface region of the InP (100) substrate being the sample 22 to which pulse laser beam has been irradiated combine with nitrogen atom, whereby the vicinity of the surface region to which has been irradiated pulse laser beam is nitrided, so that a thin film of $InN_x$ and $PN_x$ ($InN_x$—$PN_x$ thin film) is formed as a nitride compound being the one passivated chemically on the surface of the InP (100) substrate.

Figure 2:
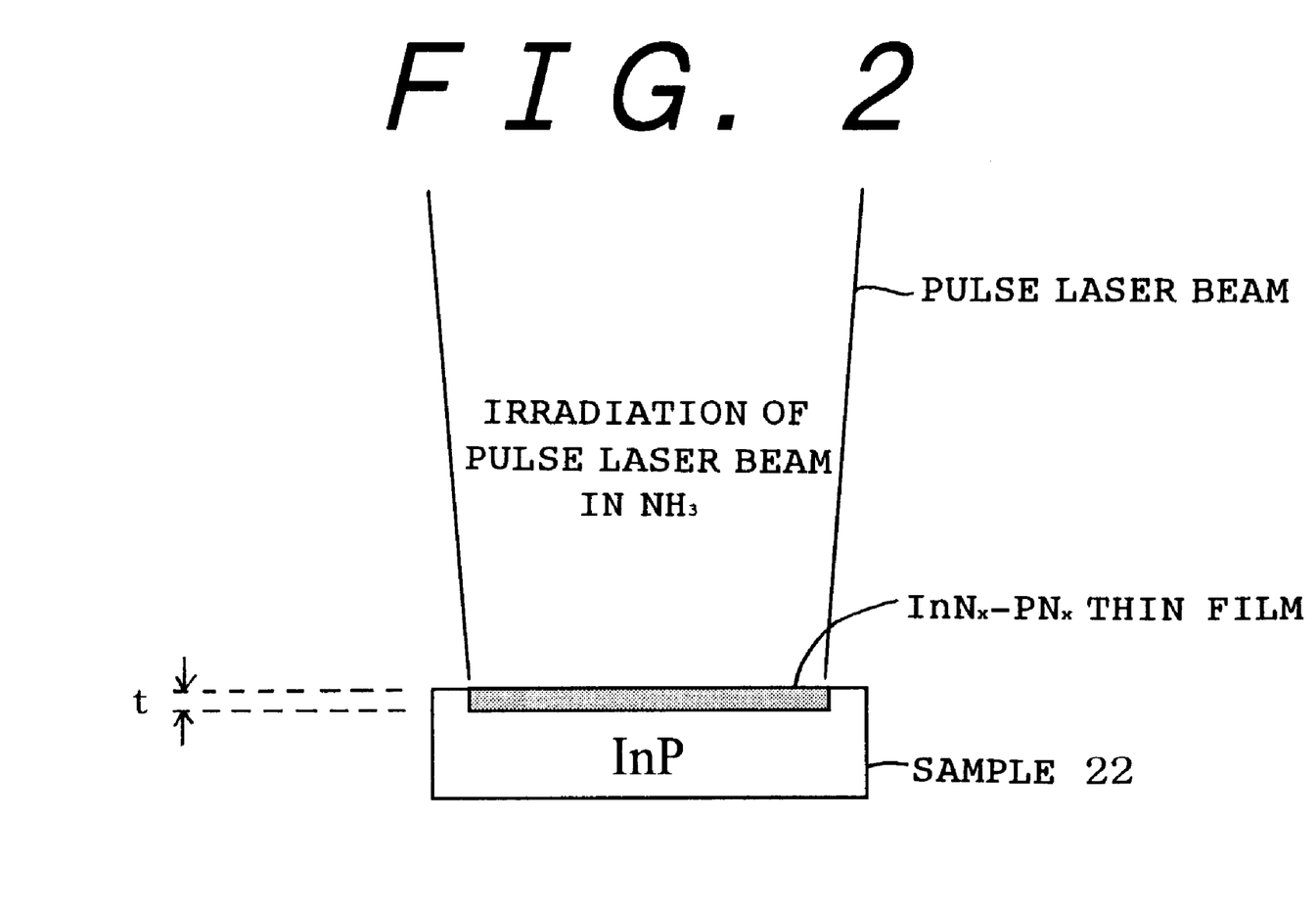
FIG. 2 is an explanatory view illustrating a state of formation of a cap layer according to a process for the formation of cap layer for semiconductors of the present invention.

Thus, the nitride compound of $InN_x$—$PN_x$ thin film formed on the surface of the InP (100) substrate can prevent oxidation on the surface of the InP (100) substrate in the atmosphere, so that the $InN_x$—$PN_x$ thin film functions as a cap layer for the surface of the InP (100) substrate.

It is conjectured that the above described $InN_x$—$PN_x$ thin film is formed as a result of phase separation, but in this respect, it will be described hereinafter by referring to experimental results.

Next, in the equipment shown in FIG. 1, experimental results of an experiment wherein a frequency of pulse laser beam output from the KrF excimer laser oscillator 10 is "1 Hz", a fluence (Ed) is "80 mJ/cm$^2$", and an irradiation pulse number is varied within a range of "irradiation pulse number n=500 to 2500" will be described.

Figure 3:
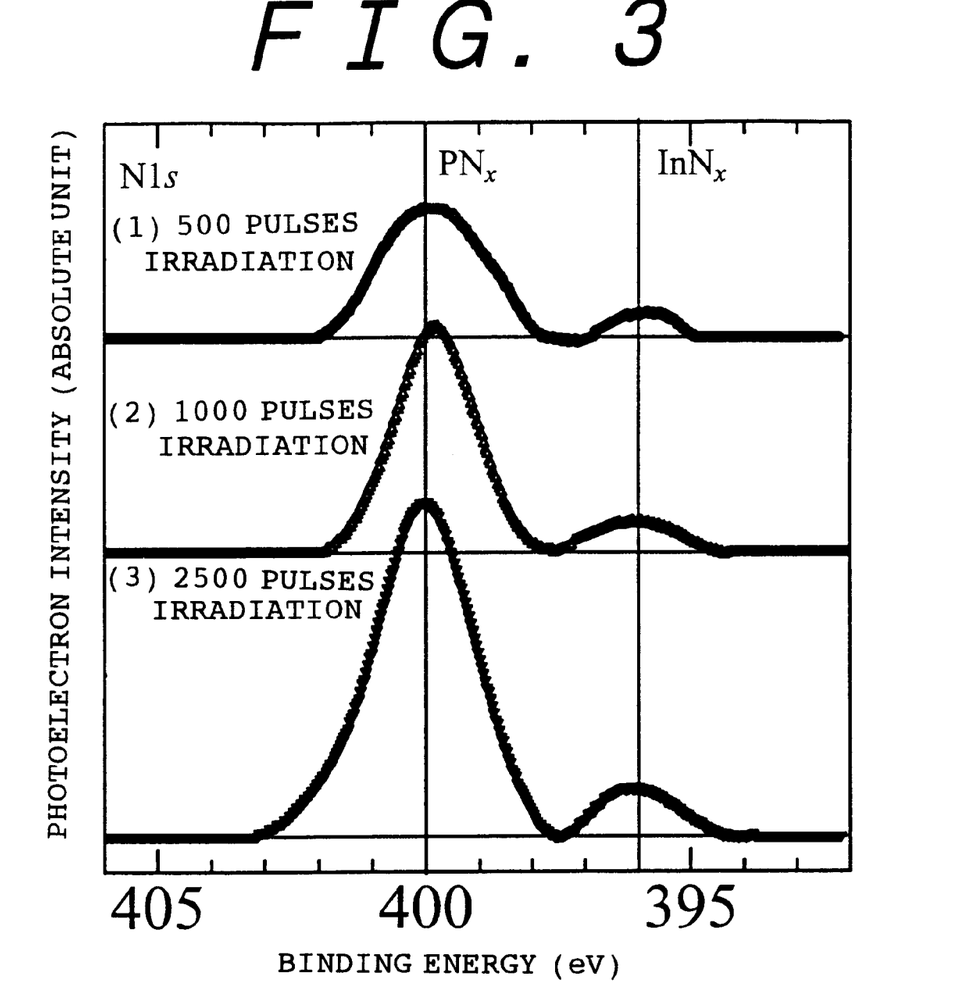
FIG. 3 is a graphical representation indicating changes of XPS spectra of nitrogen (N1s) in an InP substrate after nitriding a surface of the InP substrate by changing irradiation pulse number to irradiate pulse laser beam with respect to the surface of the InP substrate.
Figure 4:
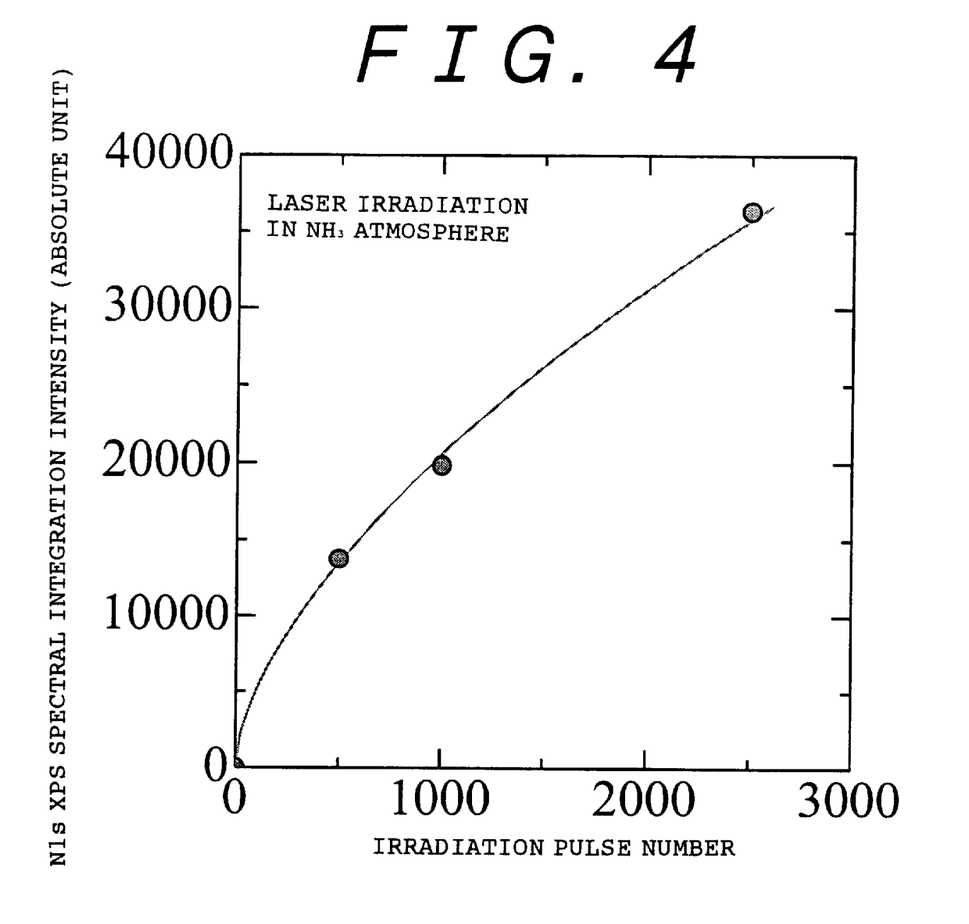
FIG. 4 is a graphical representation represented by irradiation pulse dependency obtained by integrating the respective spectra shown in FIG. 3.

First, FIG. 3 is a graphical representation indicating changes in XPS spectra of nitrogen (N1s) in an InP (100) substrate after nitriding a surface of the InP (100) substrate as a result of irradiating pulse laser beam with respect to the surface of the InP (100) substrate by changing irradiation pulse number, and FIG. 4 is a graphical representation indicated by irradiation pulse number dependency obtained by integrating the respective spectra shown in FIG. 3.

In this case, since an integrated value corresponds to the total area of the peaks, it is in a relationship in response to an amount of nitrogen (N) incorporated into the InP (100) substrate.

As shown. in the graphs of FIGS. 3 and 4, an amount of nitrogen (N) incorporated into an InP (100) substrate increases with increase in irradiation pulse number of pulse laser beam.

In other words, with increase of irradiation pulse number of pulse laser beam, it becomes possible to introduce a large amount of nitrogen into the surface of an InP (100) substrate.

Figure 5:
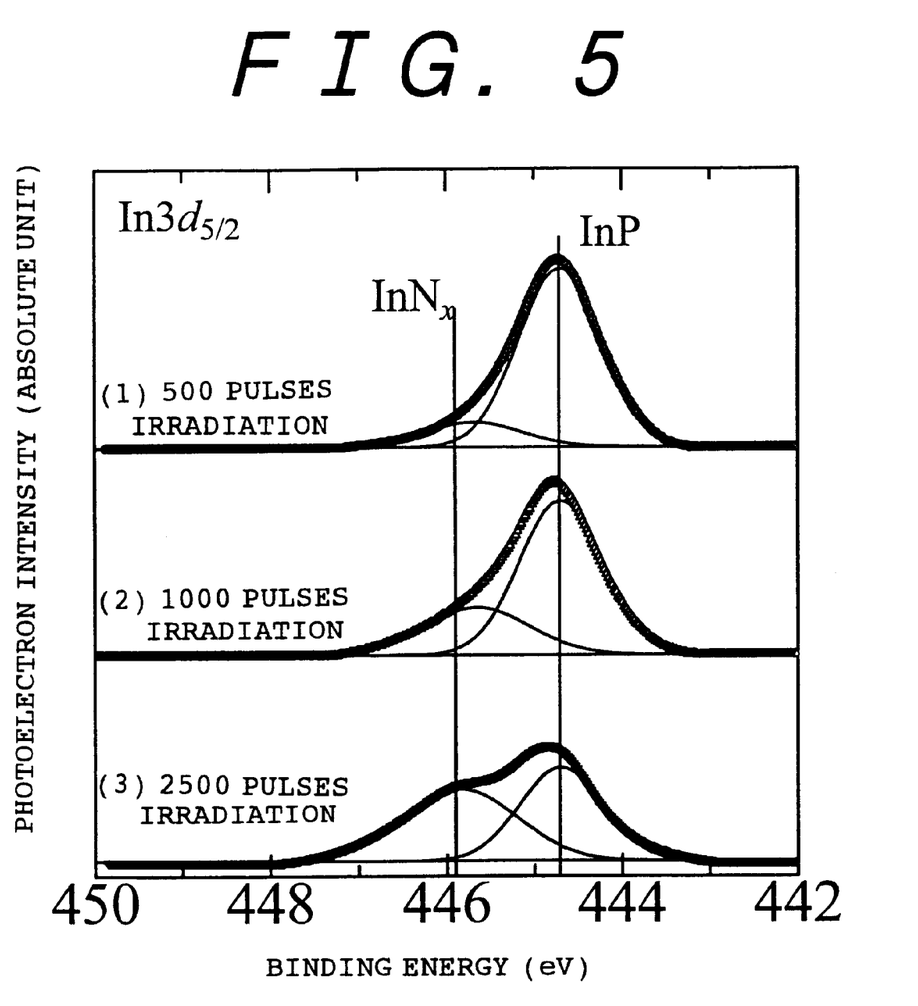
FIG. 5 is a graphical representation indicating changes of XPS spectra of indium ($In3d_{5/2}$) in an InP substrate after nitriding a surface of the InP substrate by changing irradiation pulse number to irradiate pulse laser beam with respect to the surface of the InP substrate.

FIG. 5 is a graphical representation indicating changes of XPS spectra of indium ($In3d_{5/2}$) in an InP substrate after nitriding a surface of the InP substrate by changing irradiation pulse number to irradiate pulse laser beam with respect to the surface of the InP substrate.

From the FIG. 5, the peaks of photoelectron intensity of $InN_x$ due to In—N bonding are observed on a higher energy side of the peaks of photoelectron intensity from the InP, whereby it is observed that photoelectron intensity increases with increase in irradiation pulse number.

Furthermore, from such fact that the peaks of photoelectron intensity of $InN_x$ shift to somewhat the higher energy side with increase in irradiation pulse number, it is considered that InN bonding increases also with increase of irradiation pulse number, so that such $InN_x$ having a higher N composition is formed.

As the same as that described above, FIG. 6 is a graphical representation indicating changes of XPS spectra of phosphorus (P2p) in an InP substrate after nitriding a surface of the InP substrate by changing irradiation pulse number to irradiate pulse laser beam with respect to the surface of the InP substrate.

Figure 6:
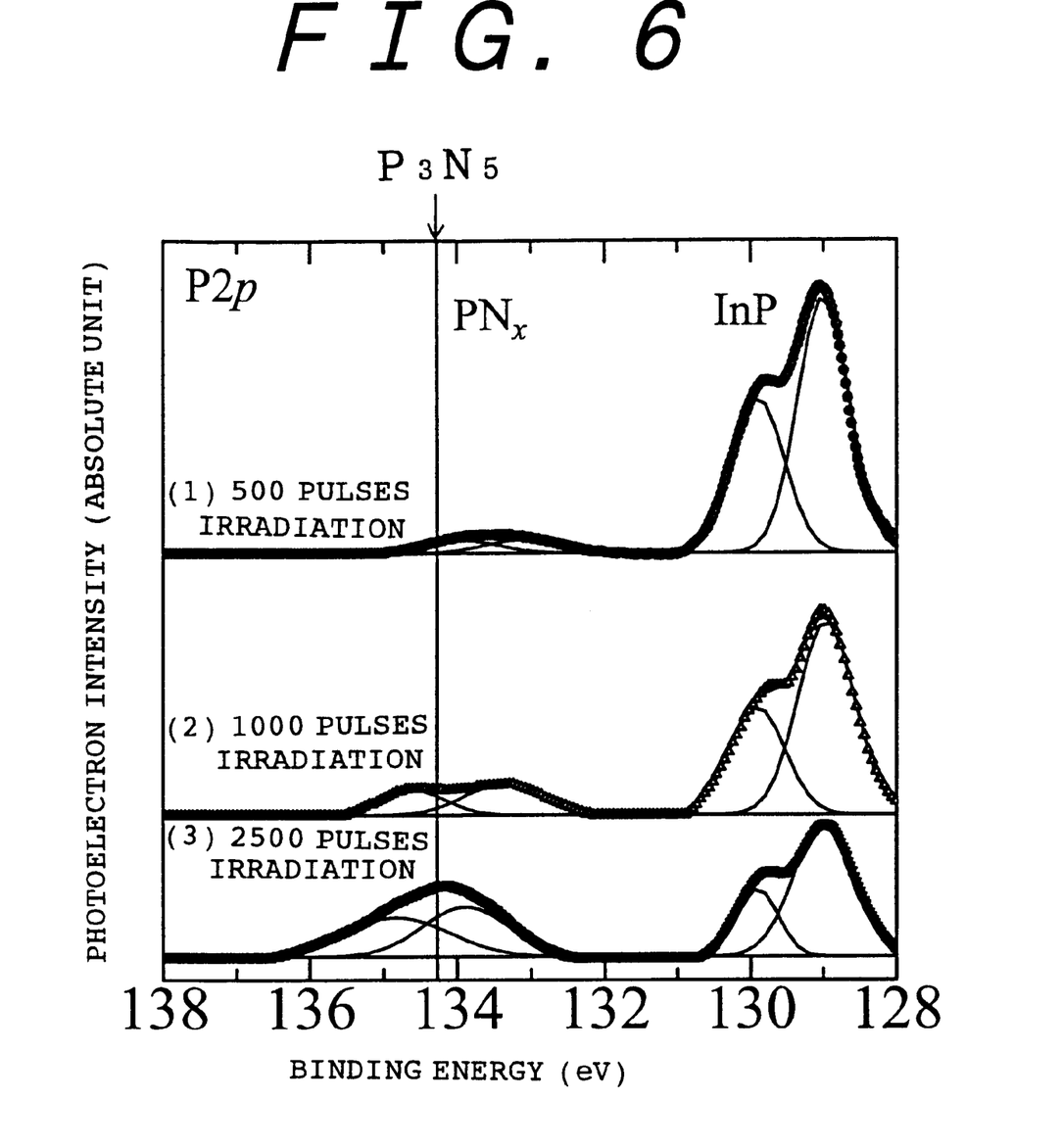
FIG. 6 is a graphical representation indicating changes of XPS spectra of phosphorus (P2p) in an InP substrate after nitriding a surface of the InP substrate by changing irradiation pulse number to irradiate pulse laser beam with respect to the surface of the InP substrate.

From the FIG. 6, it is considered that P—N bonding increases also with increase in irradiation pulse number, so that a $PN_x$ having a higher N composition is formed.

In the case where irradiation pulse number corresponds to "n=2500", in other words, when 2500 pulses of pulse laser beam are irradiated with respect to an InP (100) substrate, InN and $P_3N_5$ each having a nearly stoichiometrical composition are formed on a surface of the InP (100) substrate.

Since a degree of solid solution of nitrogen (N) is as low as several percent in a crystal of III-V compound semiconductors, it is conjectured as described above that a thin film of two material nitride compounds of these $InN_x$ and $PN_x$ ($InN_x$—$PN_x$ thin film) exist in a state of phase separation.

On one hand, a thickness t of the $InN_x$—$PN_x$ thin film formed on the surface of an InP (100) substrate (see FIG. 2) became about 10 nm or less in the case where 2500 pulses of pulse laser beam were irradiated. Functions of a cap layer can be achieved sufficiently so far as the thin film has a thickness of such degree as described above.

Figure 7:
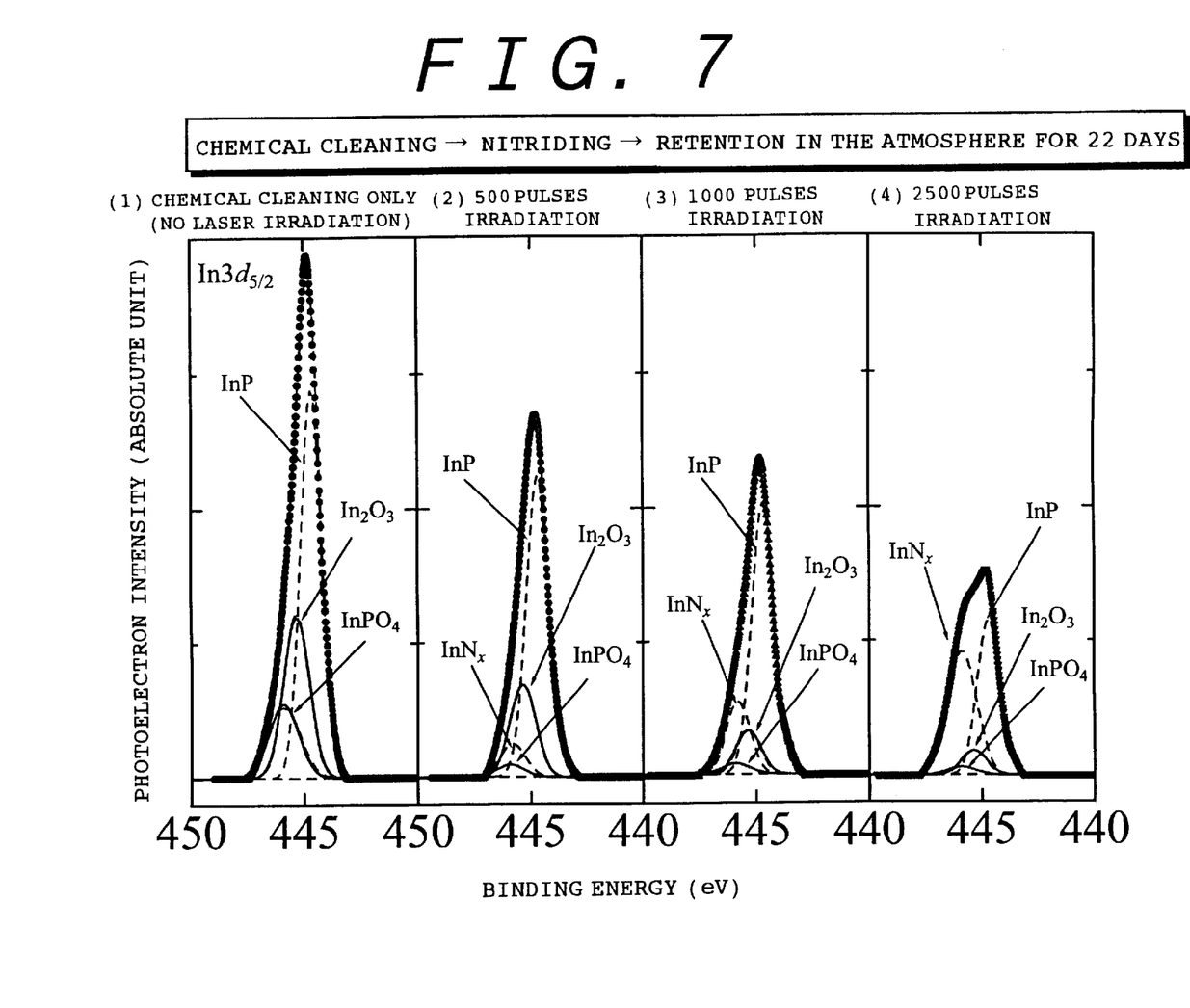
FIG. 7 is a graphical representation indicating changes in XPS spectra of indium ($In3d_{5/2}$) with respect to an InP substrate which had been maintained for 22 days in the atmosphere after a surface thereof was nitrided.
Figure 8:
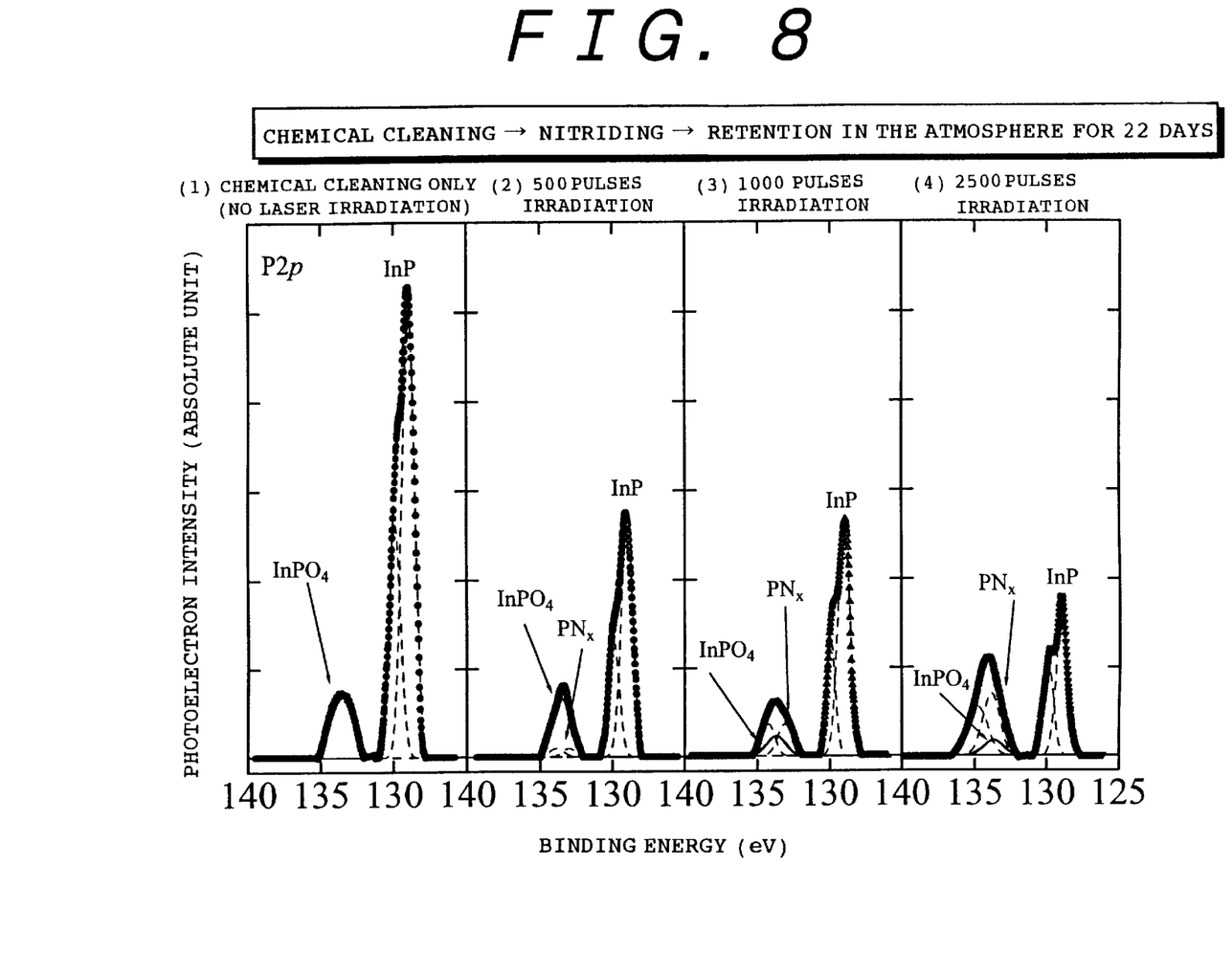
FIG. 8 is a graphical representation indicating changes in XPS spectra of phosphorus (P2p) with respect to an InP substrate which had been maintained for 22 days in the atmosphere after a surface thereof was nitrided.

Next, FIG. 7 is a graphical representation indicating changes in XPS spectra of indium ($In3d_{5/2}$) with respect to an InP substrate which had been maintained for 22 days in the atmosphere after a surface thereof was nitrided; and FIG. 8 is a graphical representation indicating similar changes in XPS spectra of phosphorus (P2p) in the same condition as that in the description of FIG. 7.

It is to be noted that in FIGS. 7 and 8, (1) denotes a case where only a cleaning (chemical cleaning) was carried out by the use of an acid solution of "HCl:HF:$H_2O$=1:1:4" at ordinary temperature for 3 minutes, but no irradiation of pulse laser beam; (2) denotes a case where a cleaning (chemical cleaning) was carried out by the use of the acid solution of "HCl:HF:$H_2O$=1:1:4" at ordinary temperature for 3 minutes, and then 500 pulses of pulse laser beam were irradiated; (3) denotes a case where a cleaning (chemical cleaning) was carried out by the use of the acid solution of "HCl:HF:$H_2O$=1:1:4" at ordinary temperature for 3 minutes, and then 1000 pulses of pulse laser beam were irradiated; and (4) denotes a case where a cleaning (chemical cleaning) was carried out by the use of the acid solution of "HCl:HF:$H_2O$=1:1:4" at ordinary temperature for 3 minutes, and then 2500 pulses of pulse laser beam were irradiated.

From FIG. 7, it is confirmed that a ratio in formation of $In_2O_3$ as well as of $InPO_4$ being oxides of indium (In) is suppressed with increase in a ratio of formation of $InN_x$, while it is confirmed from FIG. 8 that a ratio in formation of $InPO_4$ being an oxide of phosphorus (P) is suppressed with increase in a ratio of formation of $PN_x$.

Namely, even if an InP (100) substrate is maintained in the atmosphere after an $InN_x$—$PN_x$ thin film was formed on the InP (100) substrate as a cap layer, the $InN_x$—$PN_x$ thin film has a function for suppressing oxide formation, so that the $InN_x$—$PN_x$ thin film functions sufficiently as a cap layer.

Since nitrogen (N) is essentially an element of the group V, it forms a mixed crystal as a component element in III-V compound semiconductors (for example, $GaAs_{1-x}N_x$ is formed in the case where N is introduced into GaAs, while $GaP_{1-x}N_x$ is formed in the case where N is introduced into GaP).

However, a degree of solid solution of nitrogen (N) in III-V compound semiconductors is as low as several percent as described above, so that such amount of nitrogen (N) does not combine with all the component elements on the surface of an InP substrate, and thus, the InP substrate cannot avoid oxidation thereof in the atmosphere.

In this respect, InP is a material required for formation of a high performance device as described above, but it is difficult to realize surface passivation as compared with that of GaAs and the like.

In the above described embodiment, nitrogen (N) has been introduced into a target InP (100) substrate as described above to nitride a surface of the InP (100) substrate thereby to realize surface passivation of the InP (100) substrate.

More specifically, it is required for preventing a reaction with oxygen (O) that a large amount as much as possible of nitrogen (N) is introduced into InP to produce bonding of nitrogen (N) with respect to substantially all the indium (In) and the phosphorus (P) on the surface of the InP.

In the case when nitrogen (N) is introduced into InP, In—N bonding is produced, but a production temperature is close to decomposition temperature of the In—N bonding, so that nitriding must be executed at a lower temperature as much as possible. For this reason, as described in the above embodiment, it is desirable to implement such instantaneous heat treatment that pulse laser beam having a predetermined frequency and a predetermined fluence is irradiated with a predetermined pulse number, whereby the surface of an InP (100) substrate is heated instantaneously, and then, the same is instantaneously cooled, so that a temperature on the surface of the InP (100) substrate is maintained at a low temperature.

Namely, it is desirable to use irradiation of pulse laser beam of a low temperature and high efficiency for the introduction of nitrogen (N) into InP.

Then, for removal of the $InN_x$—$PN_x$ thin film (nitride film) which had been formed on the surface of the InP (100) substrate as a cap layer as described above, it is sufficient to wash the $InN_x$—$PN_x$ thin film by the use of a solution such as "HCl:HF:$H_2O$=1:1:4" acid solution.

Figure 9:
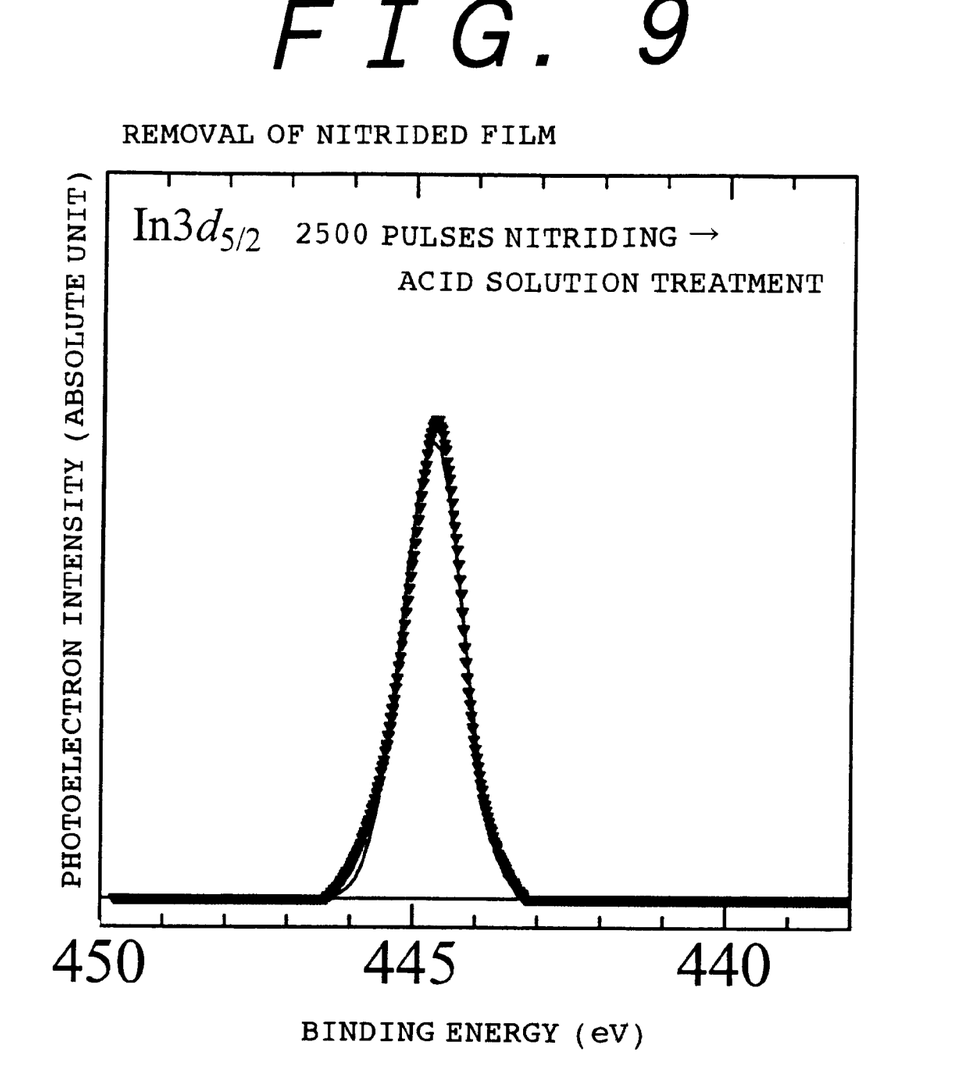
FIG. 9 is a graphical representation indicating changes in XPS spectra of indium ($In3d_{5/2}$) with respect to an InP substrate in the case where the InP substrate on which has been formed an $InN_x$—$PN_x$ thin film by irradiating pulse laser beam at 2500 pulses is washed with the use of a "$HCl:HF:H_2O=1:1:4$" solution at ordinary temperature for 3 minutes.
Figure 10:
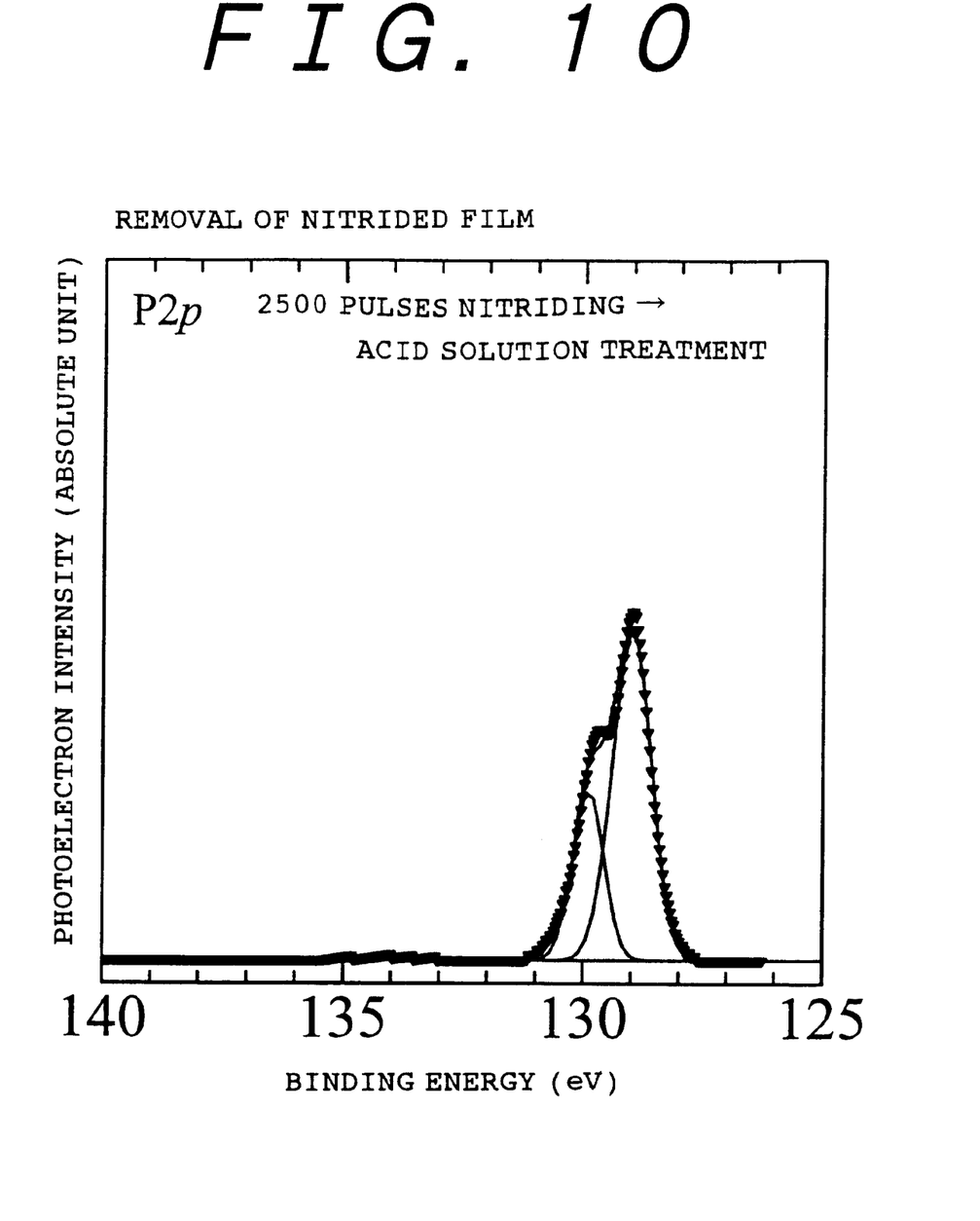
FIG. 10 is a graphical representation indicating changes in XPS spectra of phosphorus (P2p) with respect to an InP substrate in the case where the InP substrate on which has been formed an $InN_x$—$PN_x$ thin film by irradiating pulse laser beam at 2500 pulses is washed with the use of a "$HCl:HF:H_2O=1:1:4$" solution at ordinary temperature for 3 minutes.

FIG. 9 is a graphical representation indicating changes in XPS spectra of indium ($In3d_{5/2}$) with respect to an InP (100) substrate in the case where the InP (100) substrate on which has been formed an $InN_x$—$PN_x$ thin film as a cap layer by irradiating pulse laser beam at 2500 pulses is washed with the use of a "HCl:HF:$H_2O$=1:1:4" acid solution at ordinary temperature for 3 minutes; and FIG. 10 is a graphical representation indicating similar changes in XPS spectra of phosphorus (P2p) with respect to an InP (100) substrate in the same condition as that in the description of FIG. 9.

As shown in these FIGS. 9 and 10, only the peak of photoelectron intensity due to InP is observed, and no peak of photoelectron intensity due to any other material could be separated in either of the cases of FIGS. 9 and 10.

After all, it means that an $InN_x$—$PN_x$ thin film (nitride film) which had been formed on the surface of the InP (100) as a cap layer is removed by the above described washing with the use of the acid solution.

As described above, according to the above mentioned embodiment, a cap layer for III-V compound semiconductors can be formed by employing nitrogen being an element belonging to the same group as component elements for the III-V compound semiconductors without employing sulfur capable of being applied for a donor (electron feed source) in the III-V compound semiconductors, so that it becomes possible that a surface is protected with low contamination, and such surface is passivated, whereby oxidation with respect to the surface can be suppressed.

In addition to the above description, the present embodiment may be modified as mentioned in the following paragraphs (1) through (4).

(1) While InP has been used as a semiconductor for forming a cap layer in the above mentioned embodiment, the invention is not limited thereto as a matter of course, but a variety of semiconductors such as element semiconductors such as Si (silicon), and Ge (germanium); and compound semiconductors such as II-VI compound semiconductors such as ZnO (zincoxide), ZnS (zinc sulfide), ZnSe (zinc selenium), and ZnTe (zinc tellurium); or III-V compound semiconductors such as GaP (galliumphosphide), GaAs (galliumarsenide), GaSb (gallium antimonate), InAs (indium arsenide), and InSb (indium antimonate) may be used for a semiconductor on which is to be formed a cap layer.

(2) Although ammonia gas has been used as a gas containing nitrogen atom as a component element, and pulse laser beam has been irradiated in the ammonia gas in the above described embodiment, the present invention is not limited thereto as a matter of course, but a gas other than ammonia gas containing nitrogen atom as a component element may be used, or nitrogen gas is also employed, and pulse laser beam may be irradiated in any of these gases.

(3) While a heat treatment by means of irradiation of pulse laser beam has been employed as a manner for introducing nitrogen into a semiconductor by heating a surface of the semiconductor in the above described embodiment, the invention is not limited thereto as a matter of course, but a variety of manners such as plasma treatment, and ion beam irradiation may be employed.

(4) The above described embodiment as well as the above described modifications enumerated in the paragraphs (1) through (3) may be suitably combined with each other, and such combination obtained is applicable for the present invention.

Since the present invention has been constituted as described above, it exhibits an excellent advantage for providing a process for the formation of a cap layer for semiconductors with a low degree of contamination wherein the cap layer is easily formed on the surface of a semiconductor, and binding force thereof with the surface of the semiconductor is strong and stabilized, besides only the cap layer is selectively removed easily.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2000-18612 filed on Jan. 27, 2000 including specification, claims, drawings and summary are incorporated herein by reference in its entirety.

What is claimed is:

1. A process for the formation of a cap layer for semiconductors comprising:

disposing a semiconductor in a gas containing nitrogen atom as a component element;

conducting instantaneous heat treatment for a surface of said semiconductor thereby to introduce the nitrogen atom contained in said gas into a surface of a semiconductor;

wherein the surface of said semiconductor is instantaneously heated, and then cooled instantaneously, whereby a temperature in said surface of the semiconductor is maintained at a low temperature, and said instantaneous heat treatment is executed by irradiating pulse laser beam having a frequency and a fluence onto the surface of said semiconductor with a pulse number;

combining a component element of said semiconductor in the vicinity of the surface of said semiconductor into which the nitrogen atom contained in said gas has been introduced with the nitrogen atom contained in said gas to form a nitride compound being a compound of said component element of the semiconductor and the nitrogen atom contained in said gas on the surface of said semiconductor; and utilizing said nitride compound as a cap layer for the surface of said semiconductor.

2. A process for the formation of a cap layer for semiconductors as claimed in claim 1 wherein said semiconductor is a III-V compound semiconductor.

3. A process for the formation of a cap layer for semiconductors comprising:

disposing, as a semiconductor, InP being a III-V compound semiconductor in ammonia gas being a gas containing nitrogen atom as a component element;

heat-treating a surface of said InP in such a manner that pulse laser beam having a frequency and a fluence is irradiated onto the surface of said InP with a pulse number while maintaining a temperature in the surface of said InP at a low temperature thereby to introduce the nitrogen atom contained in said ammonia gas into the surface of said InP;

combining In and P being component elements of said InP in the vicinity of the surface of said InP into which the nitrogen atom contained in said ammonia gas has been introduced with the nitrogen atom contained in said ammonia gas to form a then film of $InN_x$ and $PN_x$ being a compound of In and P being the component elements of said InP and the nitrogen atom contained in said ammonia gas on the surface of said InP; and utilizing said thin film of the $InN_x$ and $PN_x$ as a cap layer for the surface of said InP.

* * * * *